(12) United States Patent
Ye et al.

(10) Patent No.: US 10,181,368 B2
(45) Date of Patent: Jan. 15, 2019

(54) CIRCUIT PROTECTION DEVICE

(71) Applicant: Littelfuse Electronics (Shanghai) Co., Ltd., Shanghai (CN)

(72) Inventors: Jianzhe Ye, Shanghai (CN); Bin Wang, Shanghai (CN); Hui Hu, Shanghai (CN); Tao Guo, Shanghai (CN); Jianyong Liu, Shanghai (CN)

(73) Assignee: Littelfuse Electronics (Shanghai) Co., Ltd., Shanghai (CN)

( * ) Notice: Subject to any disclaimer, the term of this patent is extended or adjusted under 35 U.S.C. 154(b) by 526 days.

(21) Appl. No.: 14/824,868

(22) Filed: Aug. 12, 2015

(65) Prior Publication Data

US 2016/0049784 A1 Feb. 18, 2016

(30) Foreign Application Priority Data

Aug. 12, 2014 (CN) .......................... 2014 2 0453852

(51) Int. Cl.
| | |
|---|---|
| *H02H 9/00* | (2006.01) |
| *H01C 7/00* | (2006.01) |
| *H01C 7/02* | (2006.01) |
| *H02H 9/02* | (2006.01) |
| *H02H 9/04* | (2006.01) |

(52) U.S. Cl.
CPC .............. *H01C 7/02* (2013.01); *H02H 9/026* (2013.01); *H02H 9/041* (2013.01); *H01C 7/008* (2013.01)

(58) Field of Classification Search
CPC .......... H02H 9/00; H02H 9/026; H02H 9/041; H01C 7/008; H01C 7/02
USPC ........................................................ 361/91.5
See application file for complete search history.

(56) References Cited

U.S. PATENT DOCUMENTS

| | | | | |
|---|---|---|---|---|
| 2002/0140540 | A1* | 10/2002 | Chen | H01C 1/1406 338/22 R |
| 2004/0109275 | A1* | 6/2004 | Whitney | H01C 7/021 361/93.1 |
| 2006/0215342 | A1* | 9/2006 | Montoya | H01C 1/148 361/103 |

* cited by examiner

*Primary Examiner* — Kevin J Comber

(57) ABSTRACT

A circuit protection device including a PTC device and a diode. A first insulation layer is formed between first electrode surfaces of the diode and the PTC device. Vias for thermally and electrically connecting the first electrode surfaces of the diode and the PTC device are formed in the first insulation layer. First, second, and third external electrode pads are provided on a second insulation layer formed on the second electrode surface of the PTC device. The second electrode surface of the PTC device is electrically connected to the first external electrode pad. The first electrode surface of the diode and the first electrode surface of the PTC device are electrically connected to the second external electrode pad. A second electrode surface of the diode is electrically connected to the third external electrode pad.

8 Claims, 4 Drawing Sheets

CIRCUIT PROTECTION DEVICE

CROSS-REFERENCE TO RELATED APPLICATION

This application claims the benefit of Chinese Patent Application No. 201420453852.1 filed on Aug. 12, 2014 in the State Intellectual Property Office of China, the whole disclosure of which is incorporated herein by reference.

FIELD OF THE INVENTION

Embodiments of the present disclosure relate to a circuit protection device, especially to a circuit protection device comprising a Positive Temperature Coefficient (PTC) device.

BACKGROUND OF THE INVENTION

FIG. 4 is a structural schematic view showing a conventional circuit protection device 280 comprising a PTC device and FIG. 5 is a cross-section view of FIG. 4.

In the conventional technique shown in FIGS. 4 and 5, a PTC device includes PTC materials 246 and a first metal electrode layer 248 and a second metal electrode layer 250 covering two side surfaces of the PTC materials 246, respectively.

As shown in FIGS. 4 and 5, the circuit protection device 280 includes the PTC device and a diode 244 welded to the first metal electrode layer 248 of the PTC device. One electrode of the diode 244 is electrically connected to the first metal electrode layer 248 of the PTC device and the other electrode of the diode 244 is led out by a wire 258. One electrode of the PTC device is led out by a wire 259 and the other electrode of the PTC device is formed of a portion 262 of the second metal electrode layer 250 which is uncovered. Furthermore, insulating cement 249, 251 covers the whole circuit protection device 280 except for the portion 262.

In the conventional circuit protection device shown in FIGS. 4 and 5, if overvoltage occurs in the circuit, heat generated in the diode 244 cannot be timely conducted to the PTC device, failing to cause the PTC device to timely come to a high resistance state, thus failing to timely provide the circuit with overvoltage protection.

In the conventional circuit protection device shown in FIGS. 4 and 5, it is necessary to lead out the electrodes of the PTC device and the diode by way of the wires 258, 259. Therefore, it is necessary to weld the wires 258, 259 to the electrodes of the diode and the PTC device, which can be time-consuming and labored, causing low production efficiency, thus not being suitable for mass production manufacturing.

In addition, in the conventional circuit protection device shown in FIGS. 4 and 5, the circuit protection device has a large contour and, therefore, does not have a compact structure.

SUMMARY

The purpose of the present disclosure is intended to solve at least one aspect of the above issues and faults in the prior art.

It would be advantageous to provide a circuit protection device, which may protect the circuit from overcurrent and overvoltage in a timely manner.

It would also be advantageous to provide a circuit protection device which is relatively simple in structure and relatively easy to manufacture.

It would also be advantageous to provide a circuit protection device with a compact structure and a small contour.

A circuit protection device, constructed in accordance with the present invention, includes, a PTC device having a first electrode surface and a second electrode surface opposite to the first electrode surface of the PTC device and a diode having a first electrode surface and a second electrode surface opposite to the first electrode surface of the diode. This circuit protection device also includes a first insulation layer disposed between the first electrode surface of the diode and the first electrode surface of the PTC device, vias extending through the first insulation layer thermally and electrically connecting the first electrode surface of the diode and the first electrode surface of the PTC device, and a second insulation layer on the second electrode surface of the PTC device. A circuit protection device, constructed in accordance with the present invention, further includes a first external electrode pad on the second insulation layer electrically connected to the second electrode surface of the PTC device, a second external electrode pad on the second insulation layer electrically connected to second electrode surface of the diode and the first electrode surface of the PTC device, and a third external electrode pad on the second insulation layer electrically connected to the second electrode surface of the diode.

Other characteristics and advantages of the present disclosure will be made clear by the following detailed description, the comprehension of which will be facilitated by reference to the attached drawings.

BRIEF DESCRIPTION OF THE DRAWINGS

The present invention will be further described in detail with reference to the accompanying drawings, in which.

DETAILED DESCRIPTION OF THE EMBODIMENT(S)

Figure 1:
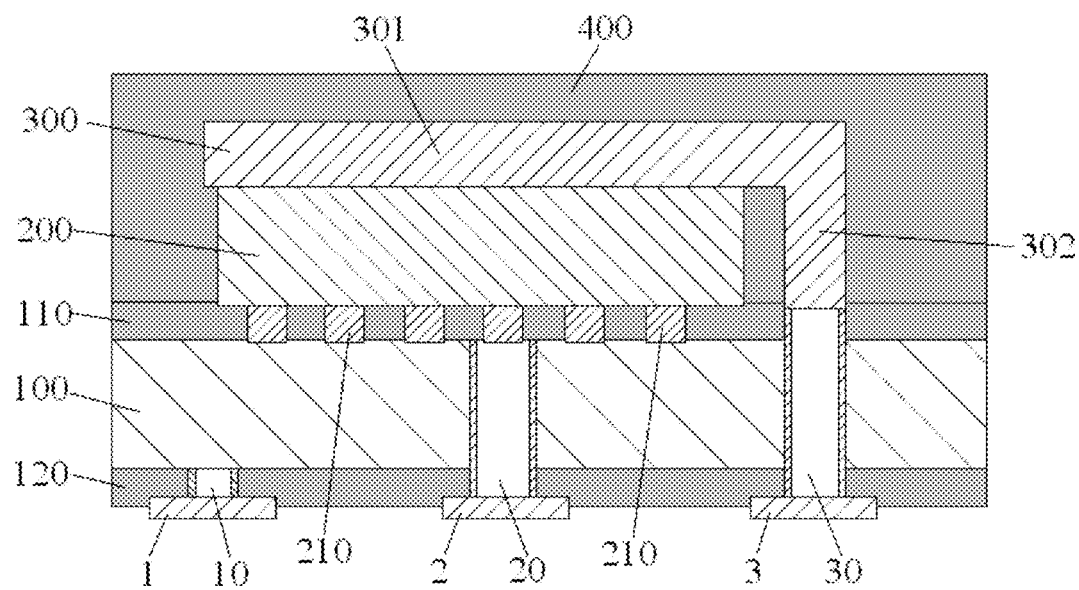
FIG. 1 is a schematic cross-section view showing a circuit protection device according to an embodiment of the present invention.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiments set forth herein; rather, these embodiments are provided so that the present disclosure will be thorough and complete and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of the present disclosure, there is provided a circuit protection device comprising a PTC device having a first electrode surface and a second electrode surface opposite to the first electrode surface and a diode having a first electrode surface and a second electrode surface opposite to the first electrode surface. The first electrode surface of the diode is mounted on the first electrode surface of the PTC device. A first insulation layer is formed between the diode and the PTC device and vias, for thermally and electrically connecting the first electrode surface of the diode and the first electrode surface of the PTC device, are formed in the first insulation layer. A second insulation layer is formed on the second electrode surface of the PTC device. A first external electrode pad, a second external electrode pad, and a third external electrode pad are provided on the second insulation layer. The second electrode surface of the PTC device is electrically connected to the first external electrode pad. The first electrode surface of the diode and the first electrode surface of the PTC device are electrically connected to the second external electrode pad. The second electrode surface of the diode is electrically connected to the third external electrode pad.

Figure 2:
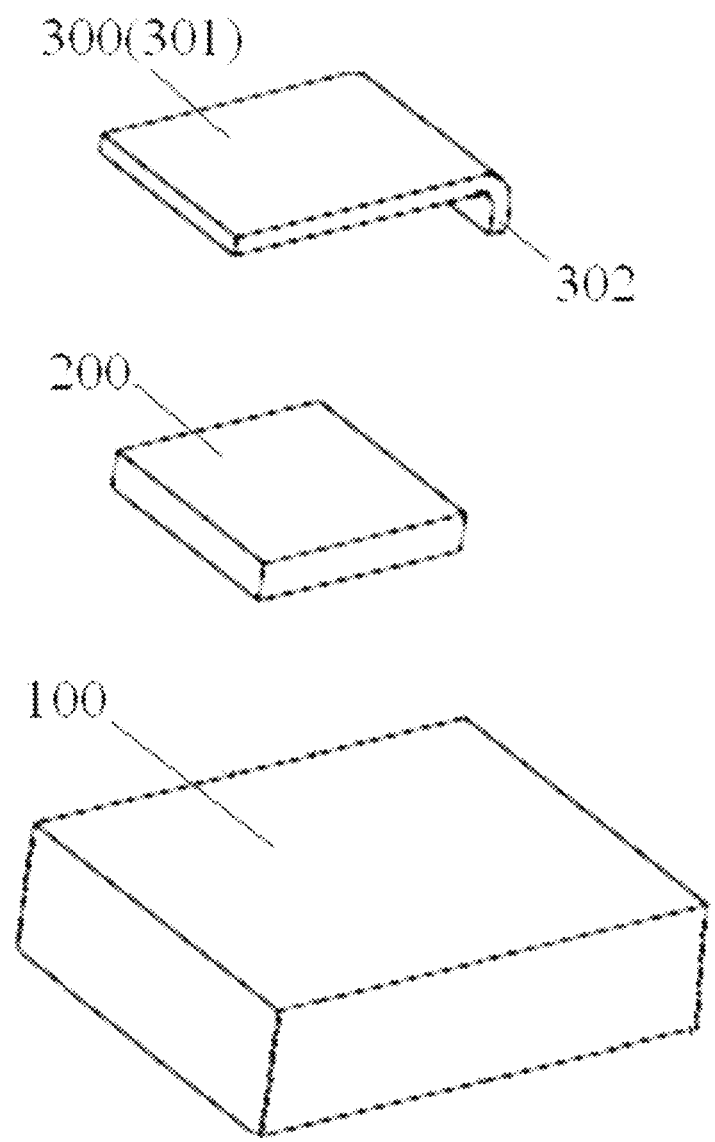
FIG. 2 is an exploded schematic view showing a PTC device, a diode, and an electric connector of the circuit protection device shown in FIG. 1.

As shown in FIGS. 1 and 2, in an embodiment of the present invention, the circuit protection device primarily comprises a PTC device 100, a diode 200, a first insulation layer 110 and a second insulation layer 120.

In the embodiment illustrated, as shown in FIGS. 1 and 2, the PTC device 100 has a first electrode surface (the upper surface in FIGS. 1 and 2) and a second electrode surface (the lower surface in FIGS. 1 and 2) opposite to the first electrode surface.

In the embodiment illustrated, as shown in FIGS. 1 and 2, the diode 200 has a first electrode surface (the lower face in FIGS. 1 and 2) and a second electrode surface (the upper face in FIGS. 1 and 2) opposite to the first electrode surface.

In an embodiment of the present invention, as shown in FIGS. 1 and 2, the first electrode surface of the diode 200 is mounted on the first electrode surface of the PTC device 100. The first insulation layer 110 is provided between the first electrode surface of the diode 200 and the first electrode surface of the PTC device 100. A plurality of vias 210 for thermally and electrically connecting the first electrode surface of the diode 200 and the first electrode surface of the PTC device 100 are formed in the first insulation layer 110.

Still referring to FIGS. 1 and 2, in an embodiment of the present invention, the second insulation layer 120 is provided on the second electrode surface of the PTC device 100. A first external electrode pad 1, a second external electrode pad 2, and a third external electrode pad 3 are provided on the second insulation layer 120.

As shown clearly in FIG. 1, the second electrode surface of the PTC device 100 is electrically connected to the first external electrode pad 1. The first electrode surface of the diode 200 and the first electrode surface of the PTC device 100 are electrically connected to the second external electrode pad 2. The second electrode surface of the diode 200 is electrically connected to the third external electrode pad 3.

As shown clearly in FIG. 2, in an embodiment of the present invention, the PTC device 100 is formed as a plate shape and the diode 200 is formed as a sheet shape. The sheet-shaped diode 200 is overlaid on the plate-shaped PTC device 100 through the first insulation layer 110. Thus, the thickness of the circuit protection device is reduced.

As shown clearly in FIG. 1, in an embodiment of the present invention, the first external electrode pad 1 is electrically connected to the second electrode surface of the PTC device 100 by a first conductive through hole 10 which penetrates the second insulation layer 120.

As shown clearly in FIG. 1, in an embodiment of the present invention, the second external electrode pad 2 is electrically connected to the first electrode surface of the diode 200 and the first electrode surface of the PTC device 100 by a second conductive through hole 20 which penetrates the second insulation layer 120 and the PTC device 100.

As shown clearly in FIG. 1, in an embodiment of the present invention, the circuit protection device further comprises an electric connector 300. One end of the electric connector 300 is electrically connected to the second electrode surface of the diode 200 and the other end of the electric connector 300 is electrically connected to the third external electrode pad 3 by a third conductive through hole 30 which penetrates the first insulation layer 110, the PTC device 100, and the second insulation layer 120.

In an embodiment of the present invention, as shown in FIGS. 1 and 2, the electric connector 300 is formed as a sheet-shaped electric connection board comprising a first portion 301 and a second portion 302. The first portion 301 is arranged parallel with the second electrode surface of the diode 200 and electrically connected to the second electrode surface of the diode 200. The second portion 302 is arranged perpendicular to the first portion 301 and electrically connected to the third external electrode pad 3 via the third conductive through hole 30.

In an embodiment of the present invention, as shown in FIGS. 1 and 2, the circuit protection device further comprises an outer insulation protection layer 400 for covering the diode 200 and the electric connector 300. In an embodiment of the present invention, the outer insulation protection layer 400 may be formed of epoxy resin.

In an embodiment of the present invention, as shown in FIG. 1, the bottom surfaces of the first external electrode pad 1, the second external electrode pad 2, and the third external electrode pad 3 are located in the same plane. Thus, the first external electrode pad 1, the second external electrode pad 2, and the third external electrode pad 3 may be simultaneously welded to a circuit board by surface mounting technology (SMT).

Figure 3:
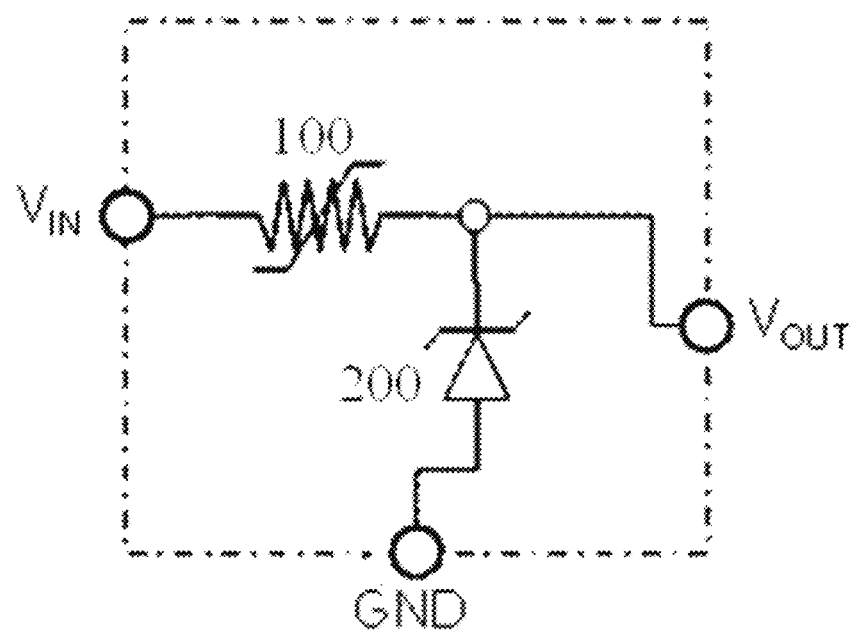
FIG. 3 is a circuit diagram of the circuit protection device shown in FIG. 1.
Figure 4:
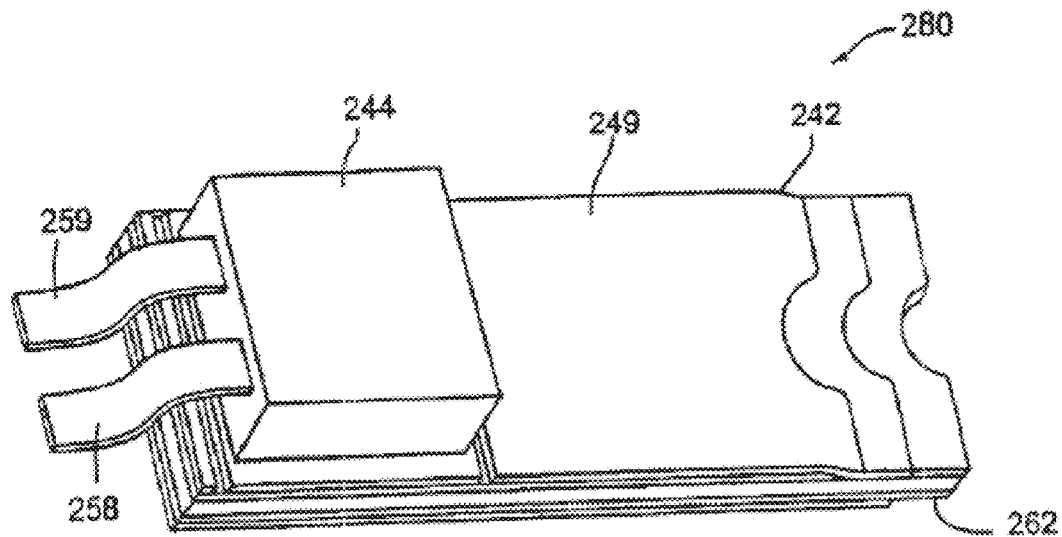
FIG. 4 is a structural schematic view showing a conventional circuit protection device.
Figure 5:
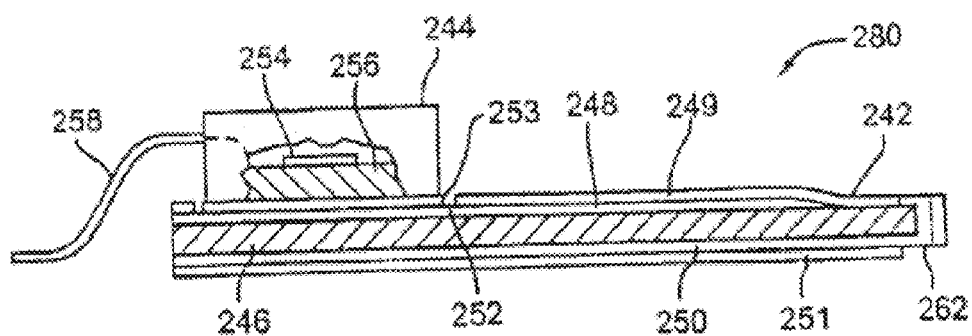
FIG. 5 is a cross-section view of FIG. 4.

FIG. 3 is a circuit diagram of the circuit protection device shown in FIG. 1. According to the circuit diagram of the circuit protection device shown in FIG. 3, it will be clearly recognized that the first electrode surface of the diode 200 is used as a negative electrode surface and the second electrode surface of the diode 200 is used as a positive electrode surface.

In the embodiment illustrated, as shown in FIGS. 1, 2 and 3, the first external electrode pad 1, electrically connected to the second electrode surface of the PTC device 100, is used as a voltage or current input end $V_{in}$. The second external electrode pad 2, electrically connected to the first electrode surface of the PTC device 100 and the first electrode surface of the diode 200, is used as a voltage or current output end $V_{out}$. The third external electrode pad 3, electrically connected to the second electrode surface of the diode 200, is used as a ground connection end GND as shown in FIG. 3.

According to circuit diagram of the circuit protection device shown in FIG. 3, it will be clearly recognized that, if overcurrent occurs in the circuit since heavy current flows through the PTC device 100, the temperature of the PTC device 100 will increase rapidly, bringing the PTC device into high resistance state, thus timely protecting the circuit from overcurrent. If overvoltage occurs in the circuit, the diode 200 will break down reversely due to high voltage, thereby generating heat. In the embodiments of the present invention, the heat generated in the diode 200 may be timely conducted to the PTC device 100 by the plurality of vias 210, causing the temperature of the PTC device 100 to increase rapidly and bringing the PTC device 100 into high resistance state, thus protecting timely the circuit from overvoltage.

It should be appreciated by those skilled in this art that the above embodiments are intended to be illustrative and not restrictive. For example, many modifications may be made to the above embodiments by those skilled in this art and various features described in different embodiments may be freely combined with each other without conflicting in configuration or principle.

Although several exemplary embodiments have been shown and described, it will be appreciated by those skilled in the art that various changes or modifications may be made in these embodiments without departing from the principles and spirit of the disclosure, the scope of which is defined in the claims and their equivalents.

As used herein, an element recited in the singular and preceded with the word "a" or "an" should be understood as not excluding plurals of the elements, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A circuit protection device, comprising:
    a PTC device having a first electrode surface and a second electrode surface opposite to the first electrode surface of the PTC device;
    a diode having a first electrode surface and a second electrode surface opposite to the first electrode surface of the diode;
    a first insulation layer disposed between the first electrode surface of the diode and the first electrode surface of the PTC device;
    vias extending through the first insulation layer thermally and electrically connecting the first electrode surface of the diode and the first electrode surface of the PTC device;
    a second insulation layer on the second electrode surface of the PTC device;
    a first external electrode pad on the second insulation layer electrically connected to the second electrode surface of the PTC device by a first conductive through hole extending through the second insulation layer;
    a second external electrode pad on the second insulation layer electrically connected to the first electrode surface of the diode and the first electrode surface of the PTC device by a second conductive through hole extending through the second insulation layer; and
    a third external electrode pad on the second insulation layer electrically connected to the second electrode surface of the diode;
    wherein the first, second, and third external electrode pads are entirely disposed on a side of the second insulation layer opposite the PTC device.

2. The circuit protection device according to claim 1, wherein the PTC device has a plate shape and the diode has a sheet shape and overlays the PTC device.

3. The circuit protection device according to claim 1, further comprising an electric connector having a first end electrically connected to the second electrode surface of the diode and a second end electrically connected to the third external electrode pad by a third conductive through hole.

4. The circuit protection device according to claim 3, wherein the electric connector has a sheet-shaped electric connection board form, and comprises:
    (a) a first portion extending parallel with the second electrode surface of the diode and electrically connected to the second electrode surface of the diode; and
    (b) a second portion perpendicular to the first portion and electrically connected to the third external electrode pad through the third conductive through hole.

5. The circuit protection device according to claim 4, further comprising an outer insulation protection layer covering the diode and the electric connector.

6. The circuit protection device according to claim 5, wherein the first electrode surface of the diode is a negative electrode surface and the second electrode surface of the diode is a positive electrode surface.

7. The circuit protection device according to claim 6, wherein:
    (a) the first external electrode pad electrically connected to the second electrode surface of the PTC device serves as a voltage or current input end;
    (b) the second external electrode pad electrically connected to the first electrode surface of the PTC device and the first electrode surface of the diode serves as a voltage or current output end; and
    (c) the third external electrode pad electrically connected to the second electrode surface of the diode serves as a ground connection end.

8. The circuit protection device according to claim 7, wherein the surfaces of the first external electrode pad, the second external electrode pad, and the third external electrode pad are in the same plane.

* * * * *